United States Patent
Choi et al.

(10) Patent No.: US 7,511,993 B2
(45) Date of Patent: Mar. 31, 2009

(54) PHASE CHANGE MEMORY DEVICE AND RELATED PROGRAMMING METHOD

(75) Inventors: Byung-Gil Choi, Yongin-si (KR); Du-Eung Kim, Yongin-si (KR); Beak-Hyung Cho, Hwaseong-si (KR); Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 14 days.

(21) Appl. No.: 11/724,268

(22) Filed: Mar. 15, 2007

(65) Prior Publication Data

US 2007/0230240 A1    Oct. 4, 2007

(30) Foreign Application Priority Data

Mar. 31, 2006    (KR) ............. 10-2006-0029692

(51) Int. Cl.
*G11C 11/00*    (2006.01)
(52) U.S. Cl. .............. 365/163; 365/148; 365/230.06
(58) Field of Classification Search ........... 365/163, 365/148, 151, 230.06
See application file for complete search history.

(56) References Cited

U.S. PATENT DOCUMENTS

| | | | |
|---|---|---|---|
| 6,480,438 B1 * | 11/2002 | Park ............... | 365/230.06 |
| 6,487,113 B1 * | 11/2002 | Park et al. ............... | 365/163 |
| 6,590,807 B2 | 7/2003 | Lowrey | |
| 6,928,022 B2 * | 8/2005 | Cho et al. ............... | 365/225.7 |
| 7,012,834 B2 * | 3/2006 | Cho et al. ............... | 365/163 |
| 7,262,990 B2 * | 8/2007 | Cho et al. ............... | 365/163 |
| 2005/0128799 A1 | 6/2005 | Kurotsuchi et al. | |
| 2005/0169093 A1 | 8/2005 | Choi et al. | |
| 2006/0007729 A1 | 1/2006 | Cho et al. | |
| 2007/0230239 A1* | 10/2007 | Choi et al. ............... | 365/163 |

FOREIGN PATENT DOCUMENTS

| | | |
|---|---|---|
| JP | 2005-166210 | 6/2005 |
| JP | 2005-222687 | 8/2005 |
| JP | 2006-024355 | 1/2006 |
| KR | 1020040105008 A | 12/2004 |
| KR | 1020050054851 A | 6/2005 |
| KR | 1020050079030 A | 8/2005 |
| KR | 1020060004289 A | 1/2006 |
| KR | 100564636 B1 | 3/2006 |

* cited by examiner

*Primary Examiner*—Gene N. Auduong
(74) *Attorney, Agent, or Firm*—Volentine & Whitt, PLLC

(57) ABSTRACT

A phase change memory device comprises a memory cell array and a write driver circuit. The memory cell array comprises a plurality of memory cells, and the write driver circuit comprises a set current driver and a reset current driver. The set current driver is adapted to provide a set current to a selected memory cell among the plurality of memory cells and the reset current driver is adapted to provide a reset current to a selected memory cell among the plurality of memory cells.

17 Claims, 5 Drawing Sheets

PHASE CHANGE MEMORY DEVICE AND RELATED PROGRAMMING METHOD

BACKGROUND OF THE INVENTION

1. Field of the Invention

Embodiments of the invention relate generally to semiconductor memory devices. More particularly, embodiments of the invention relate to phase change memory devices and related programming methods.

A claim of priority is made to Korean Patent Application No. 2006-29692, filed on Mar. 31, 2006, the disclosure of which is hereby incorporated by reference in its entirety.

2. Description of Related Art

Phase change memory devices store data using phase change materials, such as chalcogenide, which are capable of stably transitioning between amorphous and crystalline phases. The amorphous and crystalline phases (or states) exhibit different resistance values, which are used to distinguish different logic states of memory cells in the memory devices. In particular, the amorphous phase exhibits a relatively high resistance, and the crystalline phase exhibits a relatively low resistance.

At least one type of phase change memory device—phase change random access memory (PRAM)—uses the amorphous state to represent a logical "1" and the crystalline state to represent a logical "0". In a PRAM device, the crystalline state is referred to as a "set state", and the amorphous state is referred to as a "reset state". Accordingly, a memory cell in a PRAM stores a logical "0" by "setting" a phase change material in the memory cell to the crystalline state, and the memory cell stores a logical "1" by "resetting" the phase change material to the amorphous state. Various PRAM devices are disclosed, for example, U.S. Pat. Nos. 6,487,113 and 6,480,438.

The phase change material in a PRAM is converted to the amorphous state by heating the material to above a predetermined melting temperature and then quickly cooling the material (See, e.g., curve "1" in FIG. 3). The phase change material is converted to the crystalline state by heating the material at another predetermined temperature below the melting temperature for a period of time (See, e.g., curve "2" in FIG. 3). Accordingly, data is written to memory cells in a PRAM by converting the phase change material in memory cells of the PRAM between the amorphous and crystalline states using heating and cooling as described.

The phase change material in a PRAM typically comprises a compound including germanium (Ge), antimony (Sb), and tellurium (Te), i.e., a "GST" compound. The GST compound is well suited for a PRAM because it can quickly transition between the amorphous and crystalline states by heating and cooling.

The memory cells in a PRAM are called "phase change memory cells". At least one type of phase change memory cell comprises a top electrode, a chalcogenide layer, a bottom electrode contact, a bottom electrode, and an access transistor or a diode, wherein the chalcogenide layer is the phase change material for the memory cell. Accordingly, a read operation is performed on the phase change memory cell by measuring the resistance of the chalcogenide layer, and a write operation is performed on the phase change memory cell by heating and cooling the chalcogenide layer as described above.

FIG. 1 is a circuit diagram illustrating a conventional phase change memory cell 10. Referring to FIG. 1, memory cell 10 includes a phase change resistance element 11 (also labeled "GST") comprising the GST compound, and a negative metal-oxide semiconductor (NMOS) transistor 12 (also labeled "NT"). Phase change resistance element 11 is connected between a bit line BL and NMOS transistor 12, and NMOS transistor 12 is connected between phase change resistance element 11 and ground. In addition, NMOS transistor 12 has a gate connected to a word line WL.

NMOS transistor 12 is turned on in response to a word line voltage applied to word line WL. Where NMOS transistor 12 is turned on, phase change resistance element 11 receives a current through bit line BL. Although phase change resistance element 11 is connected between bit line BL and NMOS transistor 12 in FIG. 1, phase change resistance element 11 could alternatively be connected between NMOS transistor 12 and ground.

FIG. 2 illustrates a conventional phase change memory cell 20 of a diode type PRAM. Referring to FIG. 2, memory cell 20 comprises a phase change resistance element 21 (also labeled GST) connected to a bitline BL, and a diode 22 (also labeled "D") connected between phase change resistance element 21 and a wordline WL.

Phase change memory cell 20 is accessed by selecting wordline WL and bitline BL. In order for phase change memory cell 20 to work properly, wordline WL must have a lower voltage level than bitline BL when wordline WL is selected so that current can flow through phase change resistance element 21. Diode 22 is forward biased so that if wordline WL has a higher voltage than bitline BL, no current flows through phase change resistance element 21. To ensure that wordline WL has a lower voltage level than bitline BL, wordline WL is generally connected to ground when selected.

In FIGS. 1 and 2, phase change resistance elements 11 and 21 can alternatively be broadly referred to as "memory elements" and NMOS transistor 12 and diode 22 can alternatively be broadly referred to as "select elements".

The operation of phase change memory cells 10 and 20 is described below with reference to FIG. 3. In particular, FIG. 3 is a graph illustrating temperature characteristics of phase change resistance elements 11 and 21 during programming operations of memory cells 10 and 20. In FIG. 3, a reference numeral "1" denotes temperature characteristics of phase change resistance elements 11 and 21 during a transition to the amorphous state, and a reference numeral "2" denotes temperature characteristics of phase change resistance elements 11 and 21 during a transition to the crystalline state.

Referring to FIG. 3, in a transition to the amorphous state, a current is applied to the GST compound in phase change resistance elements 11 and 21 for a duration T1 to increase the temperature of the GST compound above a melting temperature Tm. After duration T1, the temperature of the GST compound is rapidly decreased, or "quenched", and the GST compound assumes the amorphous state. On the other hand, in a transition to the crystalline state, a current is applied to the GST compound in phase change resistance elements 11 and 21 for an interval T2 (T2>T1) to increase the temperature of the GST compound above a crystallization temperature Tc (Tc <Tm) for a desired period of time. After interval T2, the GST compound is slowly cooled down below the crystallization temperature so that it assumes the crystalline state.

Most phase change memory devices include a write driver circuit for supplying a program current to the GST compound in selected phase change resistance elements during programming operations. The write driver circuit typically supplies the program current with different levels depending on whether the selected phase change resistance elements are to be placed in the amorphous state or the crystalline state. Typically, a current for placing the selected phase change resistance elements in the amorphous state is referred to as a reset current and a current for placing the selected phase change resistance elements in the crystalline state is referred to as a set current. The reset and set currents are typically generated using an externally supplied power source voltage having a voltage level of at least 2.5 V.

FIG. 4 is a circuit diagram illustrating a write driver circuit 30 for a conventional phase change memory device. Write driver circuit 30 of FIG. 4 is described in detail in Korean Patent Application No. 2003-35607, which is incorporated by reference. However, for convenience, a brief description of write driver circuit 30 will be described below.

Referring to FIG. 4, write driver circuit 30 comprises a pulse control circuit 31, a current control circuit 32, and a current driving circuit 33. Pulse control circuit 31 comprises first and second transfer gates TG1 and TG2, and first through third inverters INV1 through INV3. Current control circuit 32 comprises first through seventh transistors TR1 through TR7. First through fifth transistors TR1 through TR5 are NMOS transistors and sixth and seventh transistors TR6 and TR7 are positive metal-oxide semiconductor (PMOS) transistors. Current driving circuit 33 comprises a pull-up transistor PUTR and a pull-down transistor PDTR.

Pulse control circuit 31 receives a reset pulse P_RST as an input to first transfer gate TG1, a set pulse P_SET as an input to second transfer gate TG2, and input data DATA as an input to second inverter INV2. Current control circuit 32 receives a direct current (DC) bias voltage DC_BIAS at respective gates of first and second transistors TR1 and TR2.

Where input data DATA has a logic level "0", first transfer gate TG1 of pulse control circuit 31 is turned off, second transfer gate TG2 of pulse control circuit 31 is turned on, and third and fourth transistors TR3 and TR4 of current control circuit 32 are turned off. While second transfer gate TG2 is turned on, set pulse P_SET controls fifth transistor TR5, seventh transistor TR7, and pull-down transistor PDTR. Accordingly, where set pulse P_SET has a logic level "1", fifth transistor TR5 turns on and seventh transistor TR7 and pull-down transistor PDTR turn off. In addition, due to a current mirror effect, a current flowing through transistors TR1, TR2, TR5 and TR6 forming a first current path causes a corresponding current to flow through pull-up transistor PUTR. The current flowing through pull-up transistor PUTR is a set current I_SET, and is provided to a memory cell MC through a data line DL.

On the other hand, where input data DATA has a logic level "1", first transfer gate TG1 is turned on, second transfer gate TG2 is turned off, and third and fourth transistors TR3 and TR4 are turned on. While first transfer gate TG1 is turned on, reset pulse P_RST controls fifth transistor TR5, seventh transistor TR7, and pull-down transistor PDTR. Accordingly, where reset pulse P_RST has a logic level "1", fifth transistor TR5 turns on and seventh transistor TR7 and pull-down transistor PDTR turn off. In addition, due to the current mirror effect, a current flowing through transistors TR1, TR2, TR5 and TR6 forming a first current path and a current flowing through the transistors TR3, TR4, TR5 and TR6 forming a second current path flows through a pull-up transistor PUTR. The current flowing through pull-up transistor PUTR is a reset current I_RST, and is provided to memory cell MC through data line DL.

Reset current I_RST is greater than set current I_SET and reset pulse P_RST has a smaller pulse width than set pulse P_SET. Accordingly, reset current I_RST is applied to memory cell MC with a greater magnitude, but for a shorter time, than set current I_SET. As a result, memory cell MC is programmed to the set state or the reset state in response to set pulse P_SET or reset pulse P_RST, based on the timing and temperature characteristics illustrated in FIG. 3.

As illustrated by the above descriptions, the programming of a logical "1" (i.e., a "reset programming operation") or a logical "0" (i.e., a "set programming operation") into memory cell MC requires control of the magnitude and duration of program currents applied to the selected cell. Write circuit 30 provides both set current I_SET and reset current I_RST to memory cell MC using current driving circuit 33. In particular, current driving circuit 33 uses a current mirror to provide set current I_SET and reset current I_RST to memory cell MC.

In the reset program operation, about 1 mA of current flows through the first current path of write driver 30, about 0.15~0.2 mA of current flows through the second current path of write driver 30, and about 1 mA of current flows through current driving circuit 33. As a result, in the reset program operation, write driver 30 uses about 0.2 mA more current than required.

SUMMARY OF THE INVENTION

In recognition of at least the above problems in conventional phase change memory devices, embodiments of the invention provide phase change memory devices including write driver circuits adapted to reduce unnecessary power consumption during a reset program operation.

According to one embodiment of the invention, a phase change memory device comprises a memory cell array and a write driver circuit. The memory cell array comprises a plurality of memory cells. The write driver circuit is adapted to provide a set current and a reset current to a selected memory cell among the plurality of memory cells. The write driver circuit comprises a set current driver adapted to provide the set current and a reset current driver adapted to provide the reset current.

According to another embodiment of the invention, a method of programming a phase change memory device is provided. The memory device comprises a memory cell array and a write driver circuit, wherein the memory cell array comprises a plurality of memory cells, and the write driver circuit comprises a set current driver and a reset current driver respectively providing a set current and a reset current to a selected memory cell among the plurality of memory cells. The method comprises receiving one of a set pulse and a reset pulse according to a logic level of an input data signal, generating a reset control signal according to the logic level of the input data signal and a logic level of the reset pulse, and upon receiving the reset pulse, receiving a reset direct current (DC) voltage according to the logic level of the reset control signal and providing the reset current to the selected memory cell in response to the reset DC voltage.

BRIEF DESCRIPTION OF THE DRAWINGS

Embodiments of the invention are described with reference to the accompanying drawings. Throughout the drawings like reference labels indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. However, the actual scope of the invention is defined by the claims that follow.

Figure 5:
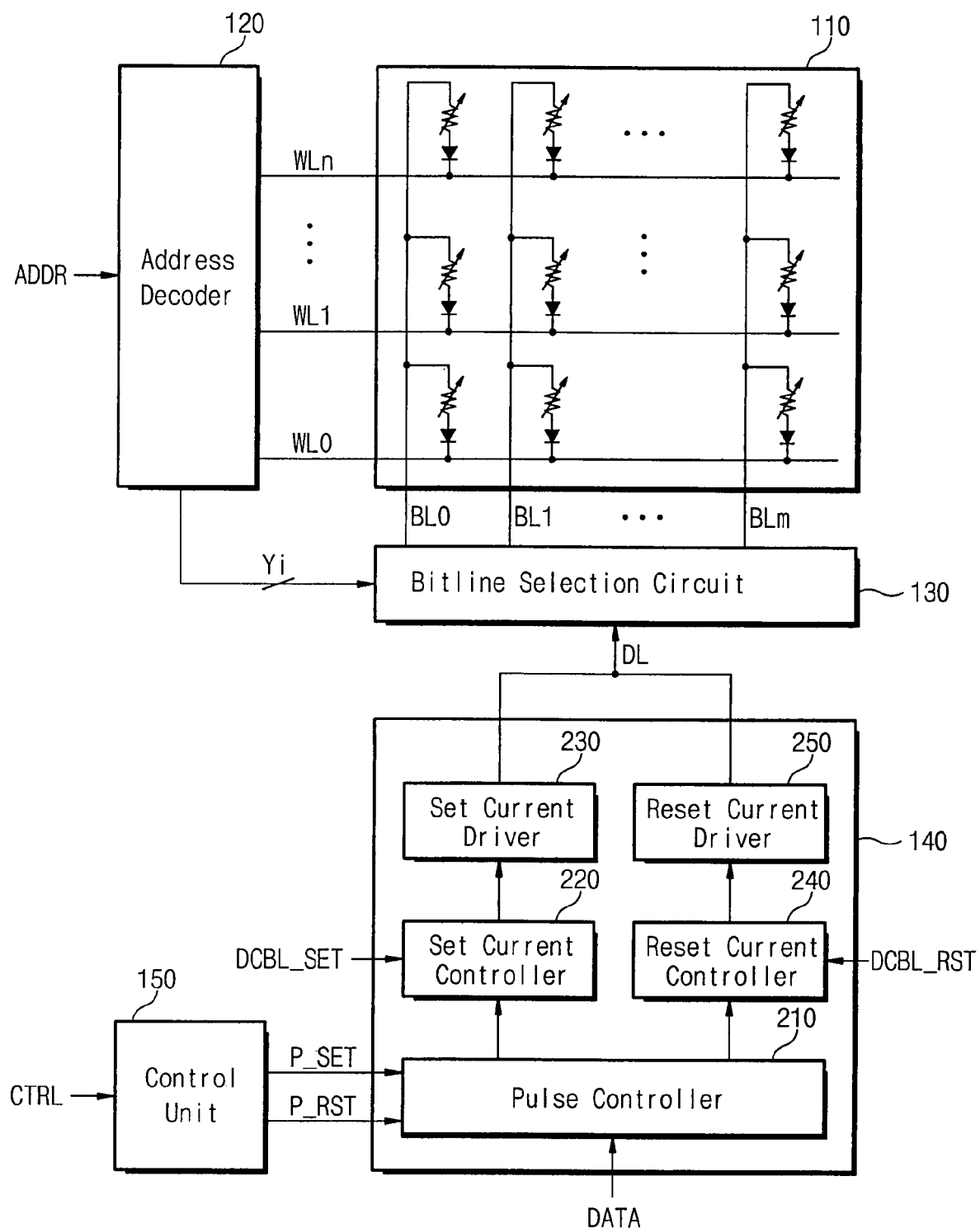
FIG. 5 is a block diagram illustrating a phase change memory device according to an embodiment of the present invention.

FIG. 5 is a block diagram illustrating a phase change memory device 100 according to one embodiment of the invention. Referring to FIG. 5, phase change memory device 100 comprises a memory cell array 110, an address decoder 102, a bit line selection circuit 130, a write driver circuit 140, and a control unit 150.

Figure 1:
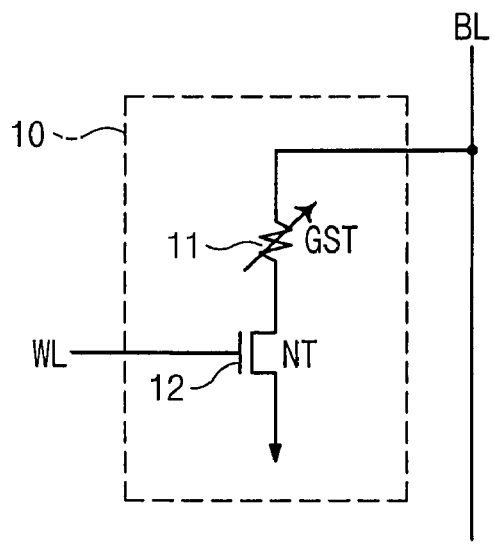
FIG. 1 is a circuit diagram illustrating a memory cell of a conventional phase change memory device.
Figure 2:
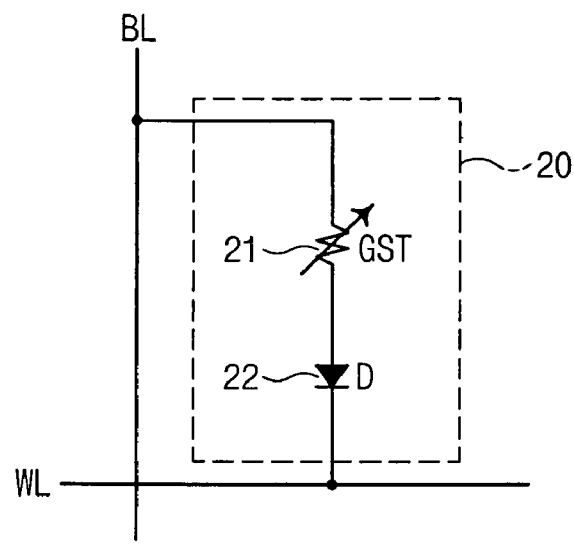
FIG. 2 is a circuit diagram illustrating a memory cell of another conventional phase change memory device.
Figure 3:
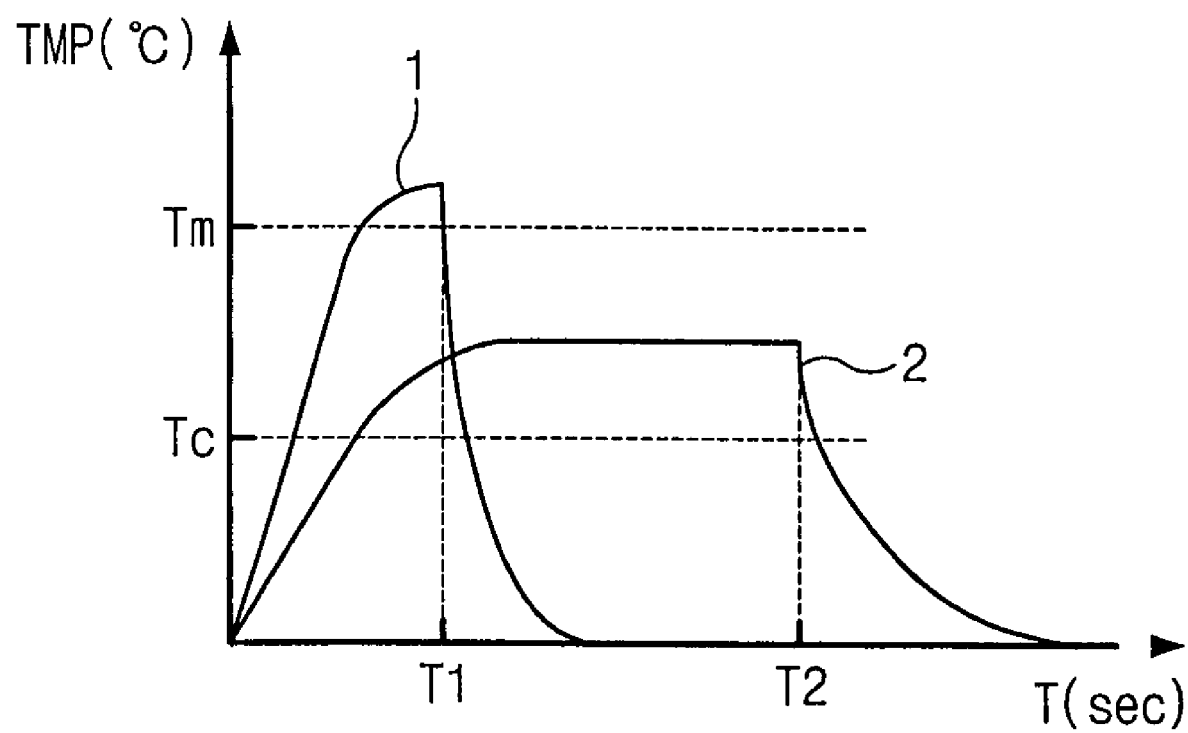
FIG. 3 is a graph illustrating temperature characteristics of a phase change material in the memory cells of FIGS. 1 and 2 during state transitions.

Memory cell array 110 comprises a plurality of memory cells. Each of the memory cells in memory cell array 110 comprises a memory element and a select element. The memory element in each memory cell comprises a phase change material GST and the select element in each memory cell comprises a diode "D". Although the select element in each memory cell of memory cell array 110 is a diode "D", the select element in each memory cell could be replaced with an NMOS transistor as illustrated, for example, in FIG. 1.

Address decoder 120 is connected to memory cell array 110 via word lines WL0 through WLn. Address decoder 120 decodes an address ADDR received from an external source, and provides a bias voltage to a selected word line based on address ADDR. In addition, address decoder 120 generates a selection signal Yi for selecting a subset of bit lines BL0 through BLm. Selection signal Yi is provided to bit line selection circuit 130.

Bit line selection circuit 130 is connected to memory cell array 110 via bit lines BL0 through BLm. Bit line selection circuit 130 selects a subset of bit lines BL0 through BLm in response to selection signal Yi provided by address decoder 120. Bit line selection circuit 130 typically comprises a plurality of NMOS transistors (not shown), where each NMOS transistor electrically connects one of bit lines BL0 through BLm to data line DL in response to selection signal Yi.

Write driver circuit 140 receives program pulse signals and input data DATA, and provides a program current to data line DL. The program pulse signals include a set pulse P_SET and a reset pulse P_RST. Write driver circuit 140 uses set pulse P_SET to generate a set current I_SET and uses reset pulse P_RST to generate a reset current I_RST. Write driver circuit 140 generates set current I_SET in response to set pulse P_SET when data DATA has logic level "0, and generates reset current I_RST in response to reset pulse P_RST when input data DATA has logic level "1".

Write driver circuit 140 comprises a pulse controller 210, a set current controller 220, a set current driver 230, a reset current controller 240, and a reset current driver 250. Pulse controller 210 receives set pulse P_SET and reset pulse P_RST from control unit 150 and input data DATA from a data input buffer (not shown), and generates control signals for controlling set current controller 220 and reset current controller 240.

Set current controller 220 and reset current controller 240 operate in response to the control signals generated by pulse controller 210. Set current controller 220 controls set current driver 230 in response to a set DC voltage DCBL_SET and reset current controller 240 controls reset current driver 250 in response to a reset DC voltage DCBL_RST. Set current driver 230 generates set current I_SET under the control of set current controller 220 and reset current driver 250 generates reset current I_RST under the control of reset current controller 240. The operation of write driver circuit 140 is described below in further detail with reference to FIG. 6.

Control unit 150 generates program pulses P_SET and P_RST in response to a control signal CTRL provided from an external source. Control signal CTRL may comprise, for example, a chip select signal/CS or a write enable signal/WE. Control unit 150 provides program pulses P_SET and P_RST to pulse controller 210 of write driver circuit 140.

Figure 4:
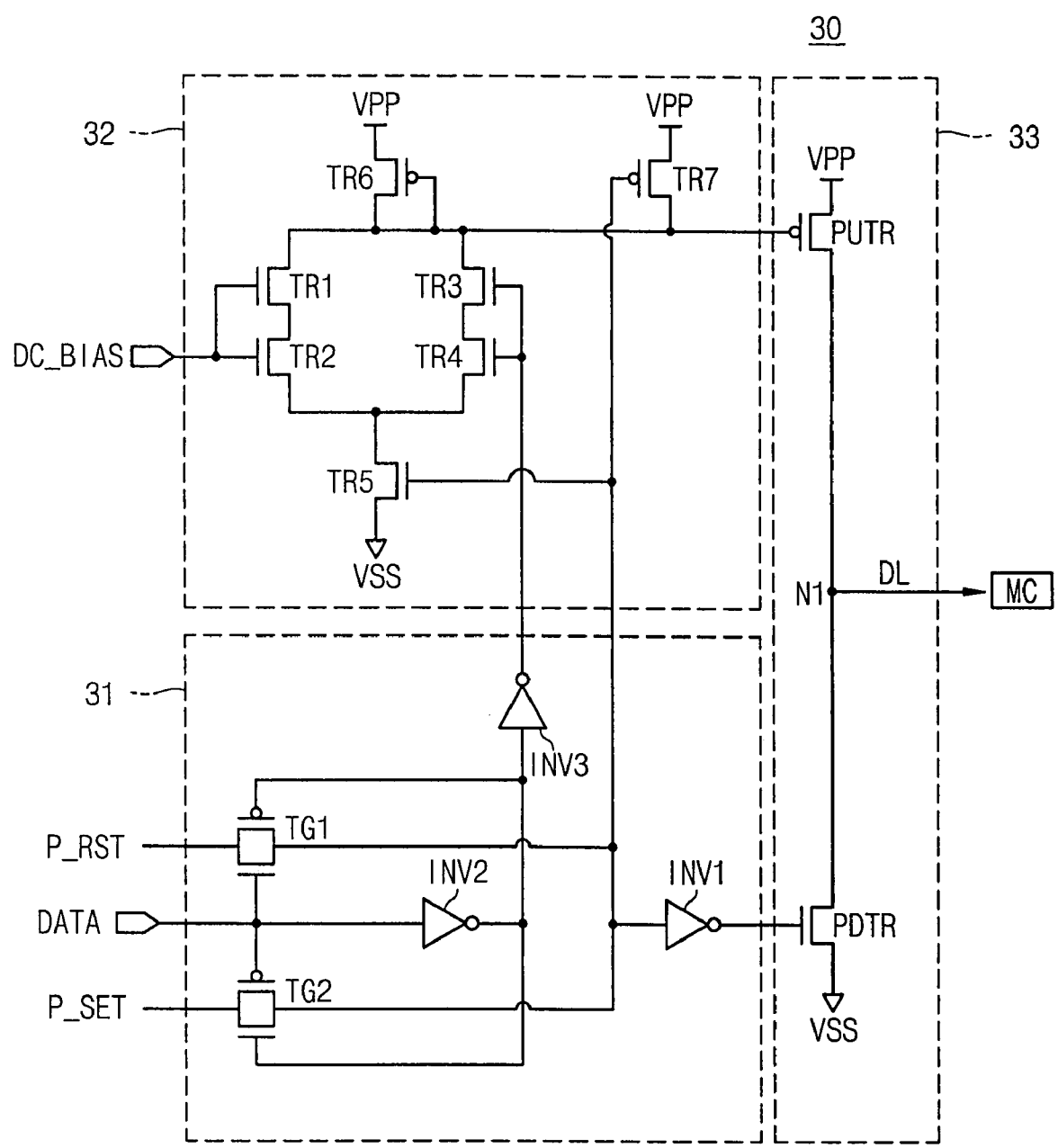
FIG. 4 is a circuit diagram illustrating a write driver circuit of a conventional phase change memory device.

Because write driver circuit 30 shown in FIG. 4 generates the set current or reset current using only one current driving circuit 33, write driver 30 requires first and second current paths. In other words, a where set current is generated in write driver 30, current flows through the first current path, and where a reset current is generated in write driver 30, current flows through the first and second current paths. Where the reset current is generated in write driver circuit 30, about 0.2 mA flows through the first and second current paths and about 1.0 mA flows through current driving circuit 33.

However, in phase change memory device 100, write driver circuit 140 includes two write drivers including set current driver 230 and reset current driver 250. During reset programming operations, write driver circuit 140 generates reset current I_RST through reset current driver 250 with an amplitude of 1 mA. In other words, during the reset programming operation, only 1 mA of current flows through reset current driver 250. Accordingly, write driver 140 uses about 0.2 mA less current than write driver 30 during reset programming operations.

Figure 6:
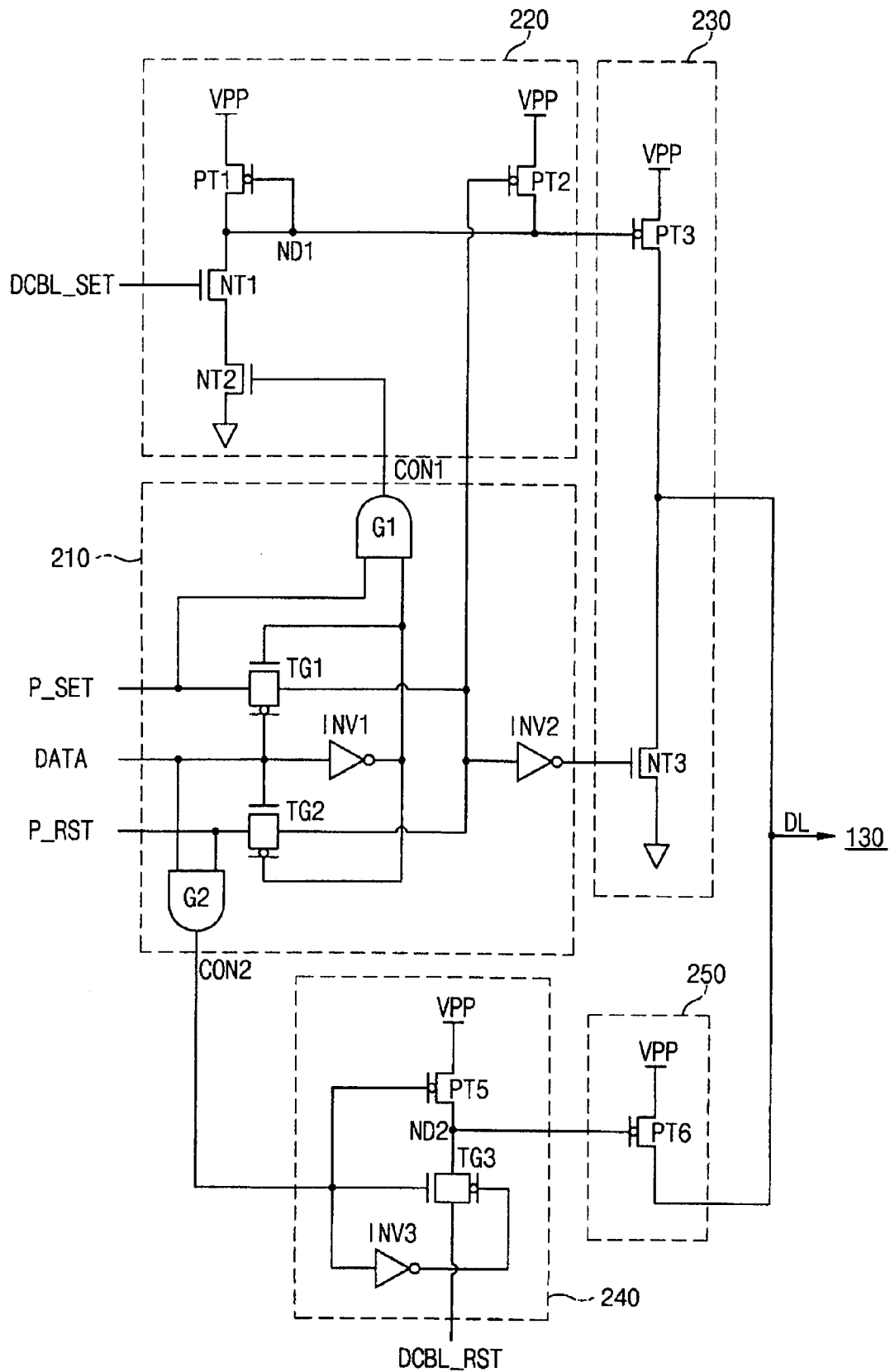
FIG. 6 is a circuit diagram illustrating an embodiment of a write driver circuit in the phase change memory device of FIG. 5.

FIG. 6 is a circuit diagram illustrating one embodiment of write driver circuit 140. The embodiment of write driver circuit 140 shown in FIG. 6 includes exemplary implementations of pulse controller 210, set current controller 220, set current driver 230, reset current controller 240 and reset current driver 250.

In FIG. 6, pulse controller 210 comprises first and second transfer gates TG1 and TG2, first and second control signal generators G1 and G2, and first and second inverters INV1 and INV2. Pulse controller 210 generates one of reset pulse P_RST and set pulse P_SET in response to a logic level of data DATA. In addition, pulse controller 210 generates a set control signal CON1 with a logic level based on a logic level of input data DATA and a logic level of set pulse signal P_SET, and generates a reset control signal CON2 in response to input data DATA and reset pulse P_RST.

Where input data DATA has logic level "0" and set pulse P_SET has logic level "1", first control signal generator G1 generates set control signal CON1 with logic level "1". Set control signal CON1 is provided to set current controller 220.

On the other hand, where input data DATA has logic level "1" and reset pulse P_RST has logic level "1", second control signal generator G2 generates reset control signal CON2 with logic level "1". Reset control signal CON2 is provided to reset current controller 240.

Set current controller 220 comprises first and second PMOS transistors PT1 and PT2 and first and second NMOS transistors NT1 and NT2. First PMOS transistor PT1 and first and second NMOS transistors NT1 and NT2 are connected in series to form one current path. Second PMOS transistor PT2 acts as a set current cut-off circuit for preventing the generation of set current I_SET.

First PMOS transistor PT1 is connected between a power terminal VPP and a first node ND1. A gate of first PMOS transistor PT1 is connected to first node ND1. First NMOS transistor NT1 is connected between first node ND1 and second NMOS transistor NT2. Set DC voltage DCBL_SET is applied to a gate of first NMOS transistor NT1. Second NMOS transistor NT2 is connected between the first NMOS transistor NT1 and ground. Set control signal CON1 is applied to a gate of second NMOS transistor NT2. Second PMOS transistor PT2 is connected to power terminal VPP and first node ND1. First and second transfer gates TG1 and TG2 are both connected to a gate of the second PMOS transistor PT2 so that set pulse P_SET or reset pulse P_RST is applied to the gate of second PMOS transistor PT2. Where set pulse P_SET or reset pulse P_RST have logic level "0", second PMOS transistor PT2 prevents set current driver 230 from generating set current I_SET.

Where set control signal CON1 is applied to second NMOS transistor NT2 with logic level "1", first PMOS transistor PT1 and first and second NMOS transistors NT1 and NT2 form a single current path. Accordingly, a current having a magnitude substantially equal to that of the current flowing through the single current path in set current controller 220 flows through set current driver 230. The current flowing through set current driver 230, which is set current I_SET, is provided to a selected memory cell through data line DL to program the selected memory cell into the set state.

Reset current controller 240 comprises a third transfer gate TG3, a fifth PMOS transistor PT5, and a third inverter INV3. Reset current controller 240 provides reset DC voltage DCBL_RST to reset current driver 250 in response to reset control signal CON2. Herein, reset DC voltage DCBL_RST has a voltage level of about 0 V.

Fifth PMOS transistor PT5 is connected between power terminal VPP and a second node ND2. Where pulse controller 210 generates reset control signal CON2 with logic level "1", fifth PMOS transistor PT5 is turned off. On the other hand, where pulse controller 210 generates reset control signal CON2 with logic level "0", fifth PMOS transistor PT5 is turned on. Where fifth PMOS transistor PT5 is turned on, second node ND2 assumes logic level "1" and reset current driver 250 does not generate reset current I_RST.

On the other hand, where fifth PMOS transistor PT5 is turned off, reset current controller 240 receives reset DC voltage DCBL_RST. Reset current driver 250 generates reset current I_RST in response to reset DC voltage DCBL_RST. Here, reset current I_RST is a current for programming the selected memory cell into the reset state.

Set current driver 230 comprises a third PMOS transistor PT3 and a third NMOS transistor NT3. Reset current driver 250 comprises a sixth PMOS transistor PT6. Set current driver 230 generates set current I_SET in response to the logic level of first node ND1. Reset current driver 250 generates reset current I_RST in response to the logic level of second node ND2. Here, where reset DC voltage DCBL_RST has a level of 0 V, reset current I_RST has a maximum value.

In the embodiments illustrated in FIGS. 5 and 6, write driver circuit 140 comprises set current driver 230 and reset current driver 250. Write driver circuit 140 drives set current driver 230 to generate the set current and drives reset current driver 250 to generate the reset current. The reset current has a magnitude of about 1 mA. Accordingly, write driver circuit 140 reduces current consumption during reset programming operations by about 0.2 mA compared with conventional write drivers such as write driver 30 shown in FIG. 4.

The foregoing exemplary embodiments are teaching examples. Those of ordinary skill in the art will understand that various changes in form and details may be made to the exemplary embodiments without departing from the scope of the invention as defined by the following claims.

What is claimed:

1. A phase change memory device, comprising:
a memory cell array comprising a plurality of memory cells; and
a write driver circuit adapted to provide a set current and a reset current to a selected memory cell among the plurality of memory cells;
wherein the write driver circuit comprises a set current driver providing a set current and controlled by a set current controller operating in response to a set control signal and a set direct current (DC) voltage, and a reset current driver providing a reset current and controlled by a reset current controller operating in response to a reset control signal and a reset DC voltage.

2. The phase change memory device of claim 1, wherein the write driver circuit further comprises:
a pulse controller receiving one of a set pulse and a reset pulse according to a logic level of an input data signal and generating the set control signal with a logic level based on the logic level of the input data and a logic level of the set pulse, and generating the reset control signal with a logic level based on a logic level of the input data signal and a logic level of the reset pulse; and
wherein the set current controller operates in response to the set control signal to control a magnitude of the set current in response to the set DC voltage; and
the reset current controller operates in response to the reset control signal to control a magnitude of the reset current in response to the reset DC voltage.

3. The phase change memory device of claim 2, wherein the pulse controller comprises:
a first transfer gate receiving the set pulse and selectively outputting the set pulse according to the logic level of the input data signal;
a second transfer gate receiving the reset pulse and selectively outputting the set pulse according to the logic level of the input data signal;
a set control signal generator generating the set control signal with the logic level based on the logic level of the input data and the logic level of the set pulse; and
a reset control signal generator generating the reset control signal with the logic level based on the logic level of the input data signal and the logic level of the reset pulse.

4. The phase change memory device of claim 2, wherein the set current controller comprises:
a positive metal-oxide semiconductor (PMOS) transistor having a first terminal receiving a power source voltage, a second terminal connected to a set node, and a gate connected to the set node;
a first negative metal-oxide semiconductor (NMOS) transistor having a first terminal connected to the set node, a second terminal, and a gate receiving the set DC voltage; and
a second NMOS transistor having a first terminal connected to the set node, a second terminal connected to ground, and a gate receiving the set control signal.

5. The phase change memory device of claim 4, wherein the set current controller further comprises:
a set current cut-off circuit adapted to prevent the set current driver from generating the set current by controlling a logic level of the set node based on a logic level of the set pulse.

6. The phase change memory device of claim 5, wherein the set current cutoff circuit comprises a PMOS transistor having a first terminal receiving the power source voltage, a second terminal connected to the set node, and a gate controlled by the logic state of the set pulse or the reset pulse.

7. The phase change memory device of claim 4, wherein the set current driver controls a magnitude of the set current according to a voltage level apparent on the set node.

8. The phase change memory device of claim 2, wherein the reset current controller comprises:
   a positive metal-oxide semiconductor (PMOS) transistor having a first terminal receiving a power source voltage, a second terminal connected to a reset node, and a gate receiving the reset control signal; and
   a transfer gate adapted to selectively transfer the reset DC voltage to the reset node based on a logic level of the reset control signal.

9. The phase change memory device of claim 8, wherein the reset DC voltage has a level of 0 V.

10. The phase change memory device of claim 8, wherein the reset current driver controls a magnitude of the reset current according to a voltage level apparent on the reset node.

11. The phase change memory device of claim 10, wherein the reset current driver comprises a PMOS transistor having a gate connected to the reset node, a first terminal receiving the power source voltage, and a second terminal connected to the selected memory cell via a data line.

12. The phase change memory device of claim 1, wherein each of the plurality of memory cells comprises:
   a memory element comprising a phase change material; and
   a select element for selecting the memory cell.

13. The phase change memory device of claim 12, wherein the select element comprises a diode connected between the memory element and a word line.

14. The phase change memory device of claim 12, wherein the select element comprises a negative metal-oxide semiconductor (NMOS) transistor having a first terminal connected to the memory element, a second terminal connected to ground, and a gate connected to a word line.

15. A method of programming a phase change memory device, the memory device comprising a memory cell array comprising a plurality of memory cells, and a write driver circuit comprising; a pulse controller, a set current driver and a corresponding set current controller, and a reset current driver and a corresponding reset current controller, the method comprising:
   receiving in the pulse controller one of a set pulse and a reset pulse according to a logic level of an input data signal, and upon receiving the reset pulse generating a reset control signal according to the logic level of the input data signal and a logic level of the reset pulse and communicating the reset control signal to the reset current controller, else upon receiving the set pulse, generating a set control signal according to the logic level of the input data signal and a logic level of the set pulse and communicating the set control signal to the set current controller;
   upon receiving the reset control pulse and a reset direct current (DC) voltage in the reset current controller, controlling the reset current driver to provide reset current to the selected memory cell, and upon receiving the set control pulse and a set DC voltage in the set current controller, controlling the set current driver to provide set current to the selected memory cell.

16. The method of claim 15, wherein the reset current driver controls a magnitude of the reset current according to a level of the reset DC voltage.

17. The method of claim 16, wherein the set current driver controls a magnitude of the set current according to a level of the set DC voltage.

* * * * *